(12) United States Patent
Scepanovic et al.

(10) Patent No.: US 6,448,699 B1
(45) Date of Patent: Sep. 10, 2002

(54) OCTAGONAL ELECTRODE FOR CRYSTALS

(75) Inventors: Dragan Scepanovic, Naperville; Leon J. Miernicki, Somanauk, both of IL (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 09/945,213

(22) Filed: Aug. 31, 2001

(51) Int. Cl.$^7$ ................................................ H01L 41/08
(52) U.S. Cl. ...................................................... 310/365
(58) Field of Search ................................. 310/320, 365, 310/366

(56) References Cited

U.S. PATENT DOCUMENTS

| | | | |
|---|---|---|---|
| 2,994,791 A | * 8/1961 | Shinada et al. | 310/365 |
| 4,123,680 A | * 10/1978 | Kemper et al. | 310/320 |
| 6,133,673 A | * 10/2000 | Kawara et al. | 310/320 |
| 6,346,762 B2 | * 2/2002 | Watanabe et al. | 310/365 X |

FOREIGN PATENT DOCUMENTS

JP        45-20226     *  9/1970 ............... 310/365

* cited by examiner

Primary Examiner—Mark O. Budd
(74) Attorney, Agent, or Firm—Mark P. Bourgeois; Mark W. Borgman

(57) ABSTRACT

A crystal electrode that reduces coupled mode noise. A crystal blank has a top surface and a bottom surface. A first electrode is located on the top surface. The first electrode has a contact portion and a polygonal portion. A second electrode is located on the bottom surface. The second electrode has a contact portion and a polygonal portion. The polygonal portions of the first and second electrodes are arranged such that they oppose each other.

8 Claims, 4 Drawing Sheets

OCTAGONAL ELECTRODE FOR CRYSTALS

BACKGROUND OF THE INVENTION

1. Field of the Invention

This invention relates to oscillators that provide a stable reference source or frequency in computers or other electronic equipment. Specifically, there is an electrode configuration for a crystal resonating device that provides less mode coupling and improved spurious noise suppression.

2. Description of the Prior Art

Various devices are well known for providing a reference frequency or source. Such devices are called oscillators. The oscillator typically has a quartz crystal source and also has electronic compensation circuitry to stabilize the output frequency. Ovenized oscillators heat the oscillator to a uniform temperature to obtain a more stable output frequency. The oscillators have been packaged on various support structures and in housings such as metal cans.

The quartz crystals have electrodes patterned on each side of the crystal. The electrodes are used to apply a voltage across the crystal. The electrodes are typically made by vacuum thin film depositing a metal such as gold through a mask onto the surface of the crystal. A typical prior art electrode configuration 10 is shown in FIG. 1. A conventional quartz crystal blank 12 has a top surface 1 2A and a bottom surface 12B. A top electrode 14 is located on top surface 12A and a bottom electrode 20 is located on bottom surface 12B. Top electrode 14 has a contact portion 16 and a circular central portion 18. Similarly, bottom electrode 20 has a contact portion 22 and a circular central portion 24. The contact portion would be attached to another electrical contact such as a substrate pad or a crystal clip in order to make an electrical connection to another electrical circuit such as an oscillator whose frequency is desired to be stabilized. The area where electrodes 14 and 20 are directly overlapping each other is indicated by area 26. As the crystal frequency is increased, the required area of the electrodes decreases. In the range of 155 Mhz, the typical electrode would be approximately 0.024 inches in diameter.

The ever increasing demand on the crystal industry today is for devices with reduced size. Due to the reduced diameter to thickness ratio in miniature quartz resonators that typically operate in thickness shear mode, coupling to unwanted flexural, face shear and thickness twist modes is very difficult to avoid. When one of these modes is excited, considerable energy transfer from the main mode to the undesirable coupled mode can occur. This results in an increase in the resonators motional resistance and will also cause a change in the frequency of resonance at a given temperature. This can cause a failure of the oscillator built with such a resonator. The oscillator may stop oscillating if the gain of the oscillator is not sufficient to compensate for the increase in the resonators series resistance. The oscillator may also fail the frequency stability requirement. For the preceding reasons, screening of finished resonators for coupled modes is usually done before they are installed in an oscillator. Typically, 1 to 10 percent of the tested resonators are defective depending on the resonator design and oscillator specifications.

Several resonator design parameters effect coupling to undesired modes. Some of these are resonator dimensions, resonator contour diopter, edge bevel, electrode size and the amount of plate-back. Frequently, many of these parameters cannot be varied because of resonator electrical parameter requirements. The main cause of bandbreaks in quartz crystals with circular geometry is coupling via non-linear elastic properties to one particular type of mode excited at integral multiples of flexure and face shear modes. Bandbreak clear regions are to expected when the electrodes span a whole number of wavelengths and terminate at nodes. Circular electrodes are clearly incompatible with this criterion for the suppression of coupling.

A current unmet need exists for an electrode design for a crystal that suppresses mode coupling.

SUMMARY OF THE INVENTION

It is a feature of the invention to provide a crystal electrode that suppresses unwanted mode coupling.

Yet, another feature of the invention is to provide an electrode for a crystal that includes a crystal blank that has a top surface and a bottom surface. A first electrode is located on the top surface. The first electrode has a contact portion and a polygonal portion. A second electrode is located on the bottom surface. The second electrode has a contact portion and a polygonal portion. The polygonal portions of the first and second electrodes are arranged such that they oppose each other.

BRIEF DESCRIPTION OF THE DRAWINGS

It is noted that the drawings of the invention are not to scale. In the drawings, like numbering represents like elements between the drawings.

DETAILED DESCRIPTION OF THE PREFERRED EMBODIMENT(S)

Figure 2:
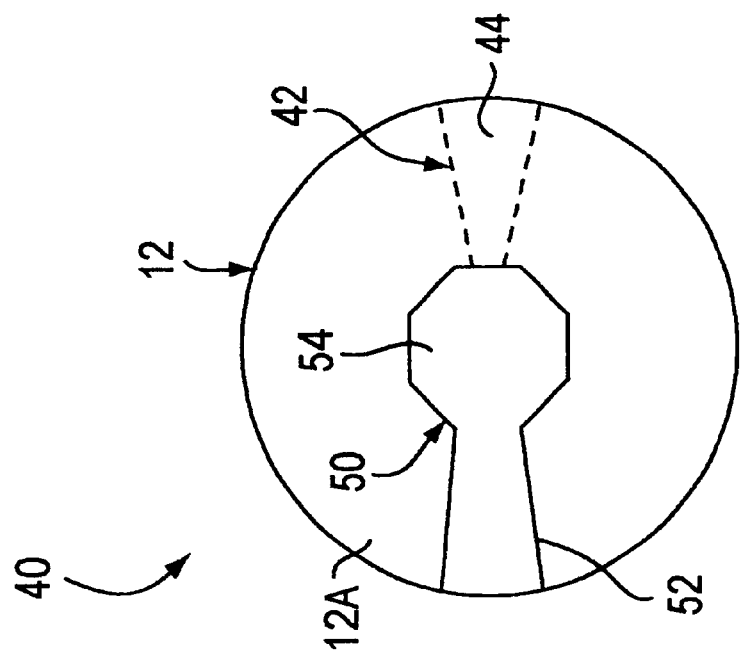
FIG. 2 is a top view of the preferred embodiment of the present invention.
Figure 4:
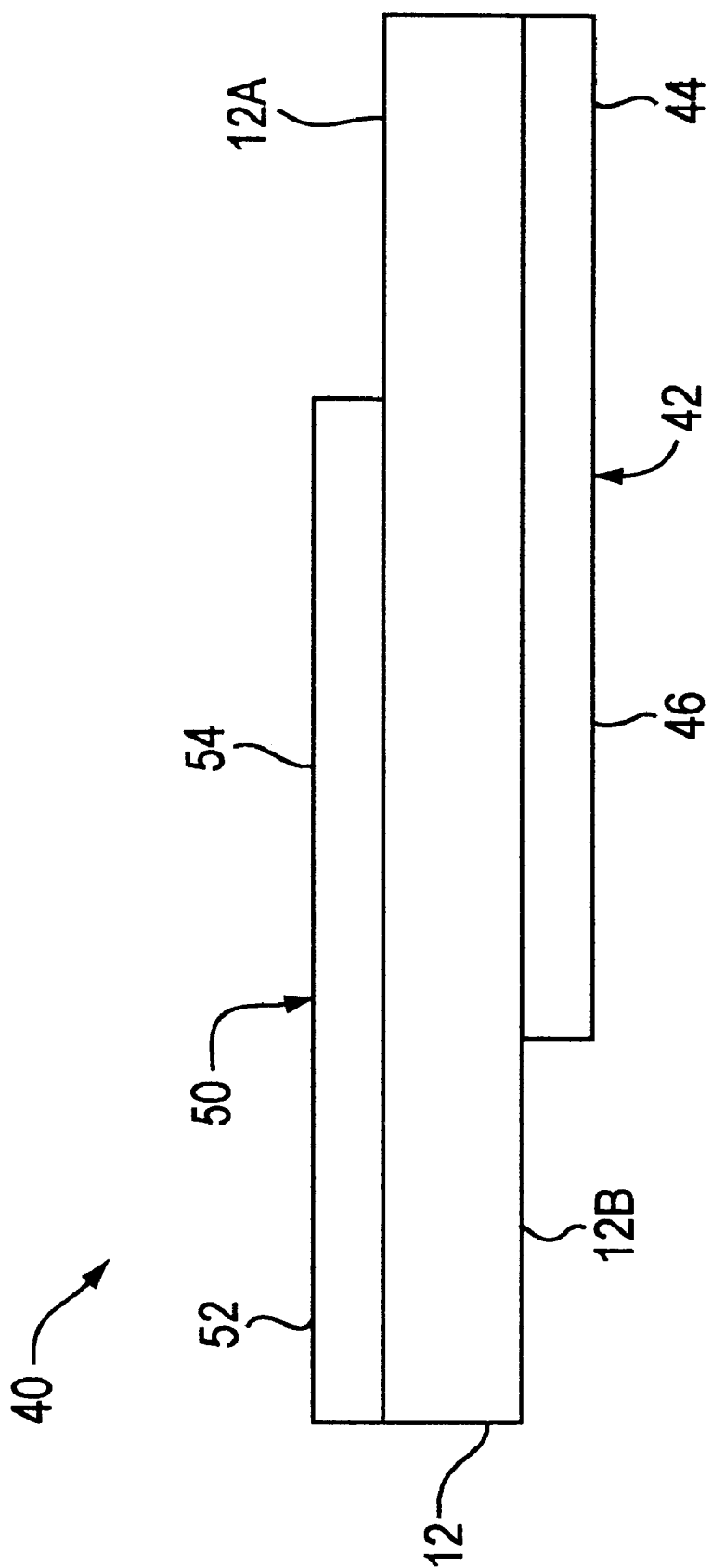
FIG. 4 is a cross-sectional view of FIG. 2.

Referring to FIGS. 2 and 4, a crystal 40 is shown. A conventional quartz crystal blank 12 has a top surface 12A and a bottom surface 12B. A top electrode 50 is located on top surface 12A and a bottom electrode 42 is located on bottom surface 12B. Top electrode 50 has a contact portion 52 and a polygonal portion 54. Similarly, bottom electrode 42 has a contact portion 44 and a polygonal portion 46. The contact portion would be attached to another electrical contact such as a substrate pad or a crystal clip in order to make an electrical connection to another electrical circuit such as an oscillator whose frequency is desired to be stabilized. Polygonal portions 46 and 54 are located opposite each other on opposite sides of crystal 12. It is noted that the polygonal portions 46 and 54 have an octagonal shape. The octagonal shape of the electrode suppresses coupled modes because reflections off the circular crystal blank edge do not come back in phase and are not reinforced.

Figure 1:
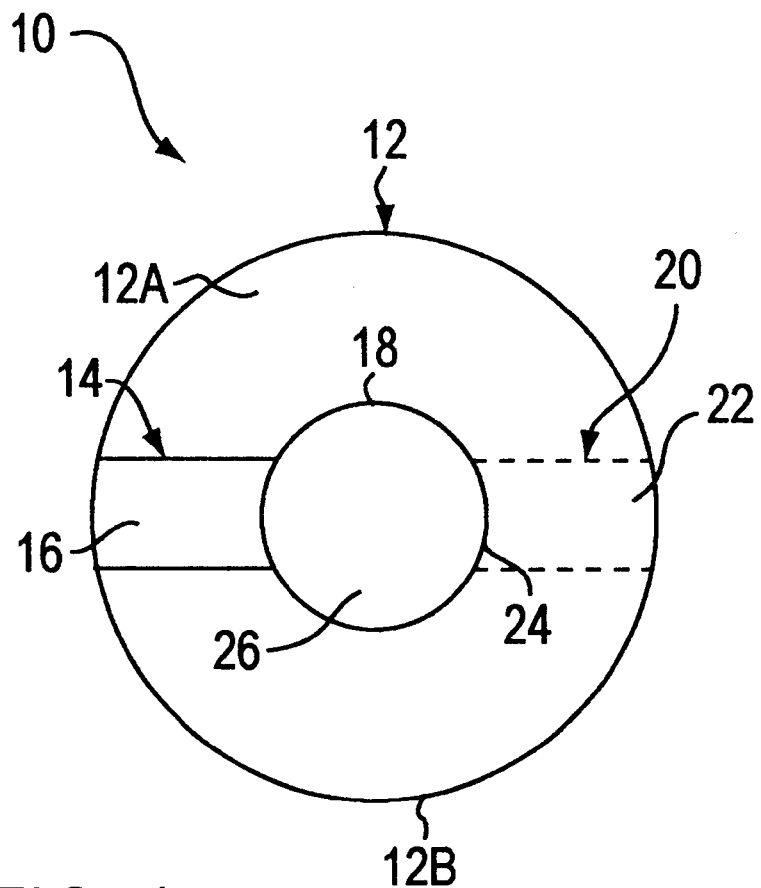
FIG. 1 is a top view of a prior art crystal.
Figure 3:
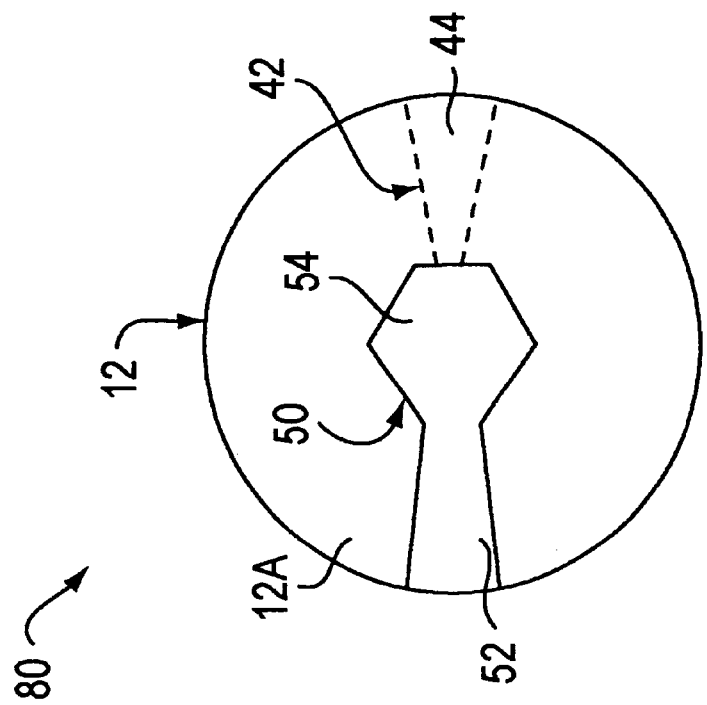
FIG. 3 is an alternative embodiment of the present invention.

Referring to FIG. 3, a crystal 80 is shown. Crystal 80 is similar to crystal 40 except that polygonal portions 46 and 54 are hexagonal shaped.

The present invention has the advantage that the polygonal electrodes produce no change in the electrical parameters of the resonator while, at the same time suppressing coupled modes.

Figure 5:
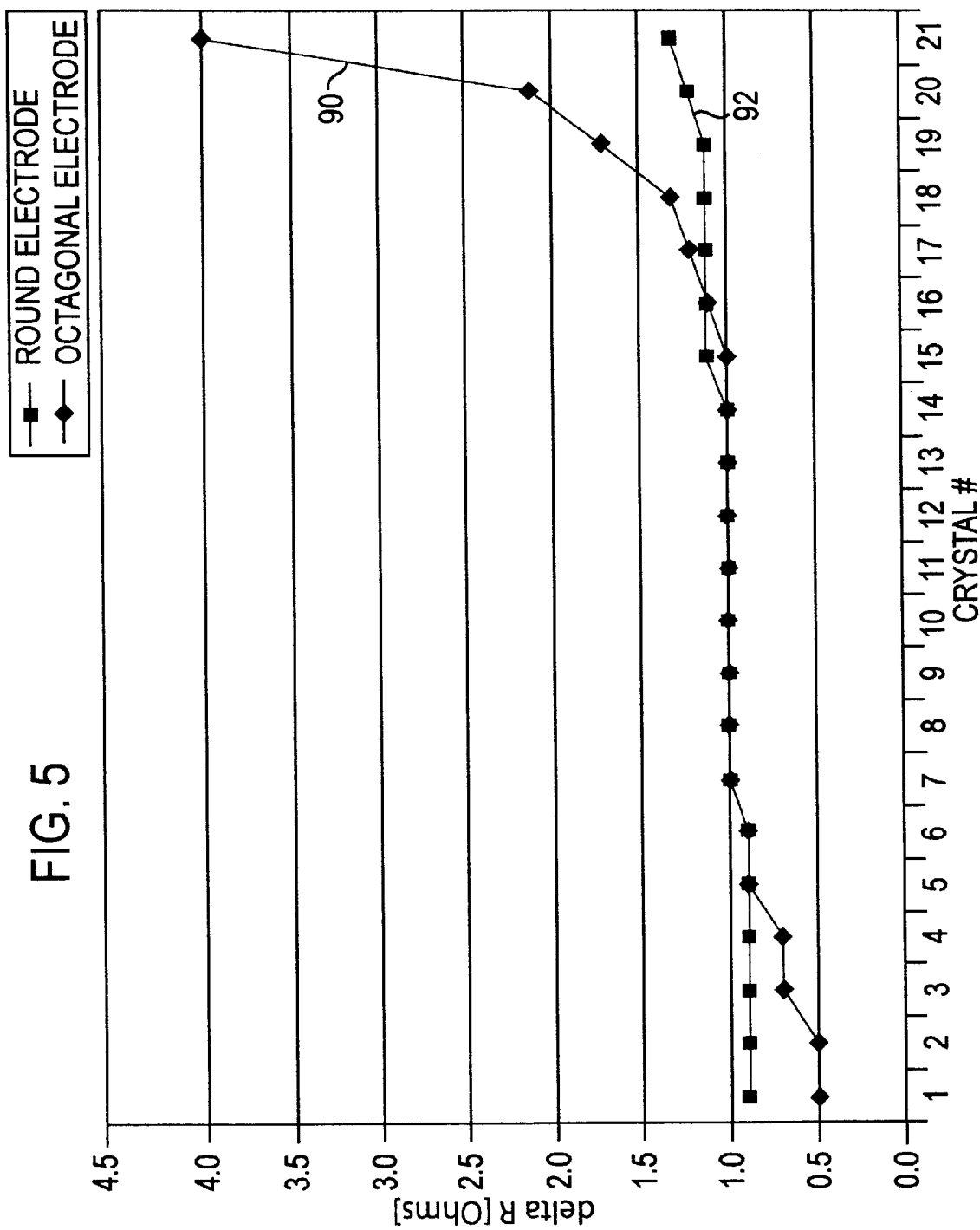
FIG. 5 is a graph of series resistance for round and octagonal crystals.

FIG. 5 is a graph of series resistance for round 90 and octagonal 92 crystals. It can be seen that the variation in series resistance is less for the octagonal crystals than for the round crystals. This is an improvement because of improved oscillator frequency stability over the operating temperature range and operating point.

The new electrode configuration could also be used with other resonators such as PZT resonators and other bulk wave devices.

While the polygonal electrodes have been shown with octagonal and hexagonal shapes, it is understood that shapes with more or less sides would also work.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. An electrode for a crystal, comprising:
   a) a crystal blank having a top surface and a bottom surface;
   b) a first electrode disposed on the top surface, the first electrode having a contact portion and an octagonal portion;
   c) a second electrode disposed on the bottom surface, the second electrode having a contact portion and an octagonal portion; and
   d) the octagonal portions of the first and second electrodes arranged such that the electrodes overlap.

2. An electrode for a crystal, comprising:
   a) a crystal blank having a top surface and a bottom surface;
   b) a first electrode disposed on the top surface, the first electrode having a contact portion and a hexagonal portion;
   c) a second electrode disposed on the bottom surface, the second electrode having a contact portion and a hexagonal portion; and
   d) the hexagonal portions of the first and second electrodes arranged such that the electrodes overlap.

3. An electrode for a crystal, comprising:
   a) a crystal blank having a first surface and a second surface;
   b) a first electrode disposed on the first surface, the first electrode having a contact portion and an octagonal portion; and
   c) a second electrode disposed on the second surface, the second electrode having a contact portion and an octagonal portion, the octagonal portions arranged opposing each other.

4. The electrode according to claim 3, wherein the contact portions are located adjacent the outer circumference of the crystal.

5. The electrode according to claim 3, wherein the octagonal portions are located in the center of the crystal.

6. The electrode according to claim 3, wherein the crystal is mounted in a oscillator.

7. The electrode according to claim 3, wherein the contact portions are electrically connected to another electrical circuit.

8. The electrode according to claim 3, wherein the electrodes reduce coupled mode noise.

* * * * *